United States Patent
Adams

(10) Patent No.: US 8,400,221 B2
(45) Date of Patent: *Mar. 19, 2013

(54) METHOD AND APPARATUS FOR BIASING AN AMPLIFIER

(75) Inventor: Charles C. Adams, Gilbert, AZ (US)

(73) Assignee: Fender Musical Instruments Corporation, Scottsdale, AZ (US)

( * ) Notice: Subject to any disclaimer, the term of this patent is extended or adjusted under 35 U.S.C. 154(b) by 116 days.

This patent is subject to a terminal disclaimer.

(21) Appl. No.: 13/028,421

(22) Filed: Feb. 16, 2011

(65) Prior Publication Data

US 2011/0135116 A1    Jun. 9, 2011

Related U.S. Application Data

(63) Continuation of application No. 12/546,456, filed on Aug. 24, 2009, now Pat. No. 7,944,302.

(51) Int. Cl.
*H03F 3/26* (2006.01)
*H03F 99/00* (2009.01)

(52) U.S. Cl. .................. 330/267; 381/120; 330/123

(58) Field of Classification Search .......... 330/262–276, 330/69, 123, 127, 10, 207 A, 251

See application file for complete search history.

(56) References Cited

U.S. PATENT DOCUMENTS

| | | | |
|---|---|---|---|
| 4,439,743 | A | 3/1984 | Schwarz et al. |
| 5,055,797 | A | 10/1991 | Chater |
| 5,424,683 | A | 6/1995 | Takahashi |
| 7,205,834 | B2 | 4/2007 | Goto |
| 7,368,992 | B2 | 5/2008 | Sandquist |

*Primary Examiner* — Hieu Nguyen
(74) *Attorney, Agent, or Firm* — Robert D. Atkins; Atkins & Associates, P.C.

(57) ABSTRACT

An apparatus and method for biasing each amplifier of an amplification stage provides that the voltage across each current sensing element of each amplifier of the amplification stage is measured. For each pair of voltage measurements taken, a sum and difference is calculated, where the sum is processed to determine minima peaks and the difference is averaged. A portion of the sum term and the average of the difference term are summed to yield the individual bias current conducted by a first amplifier of the amplification stage. The difference between a portion of the sum term and the average of the difference term is calculated to yield the individual bias current conducted by the second amplifier of the amplification stage. The bias current conducted by the first and second amplifiers may then be individually modified manually, or conversely, may be modified automatically based upon the bias current measurements taken.

26 Claims, 10 Drawing Sheets

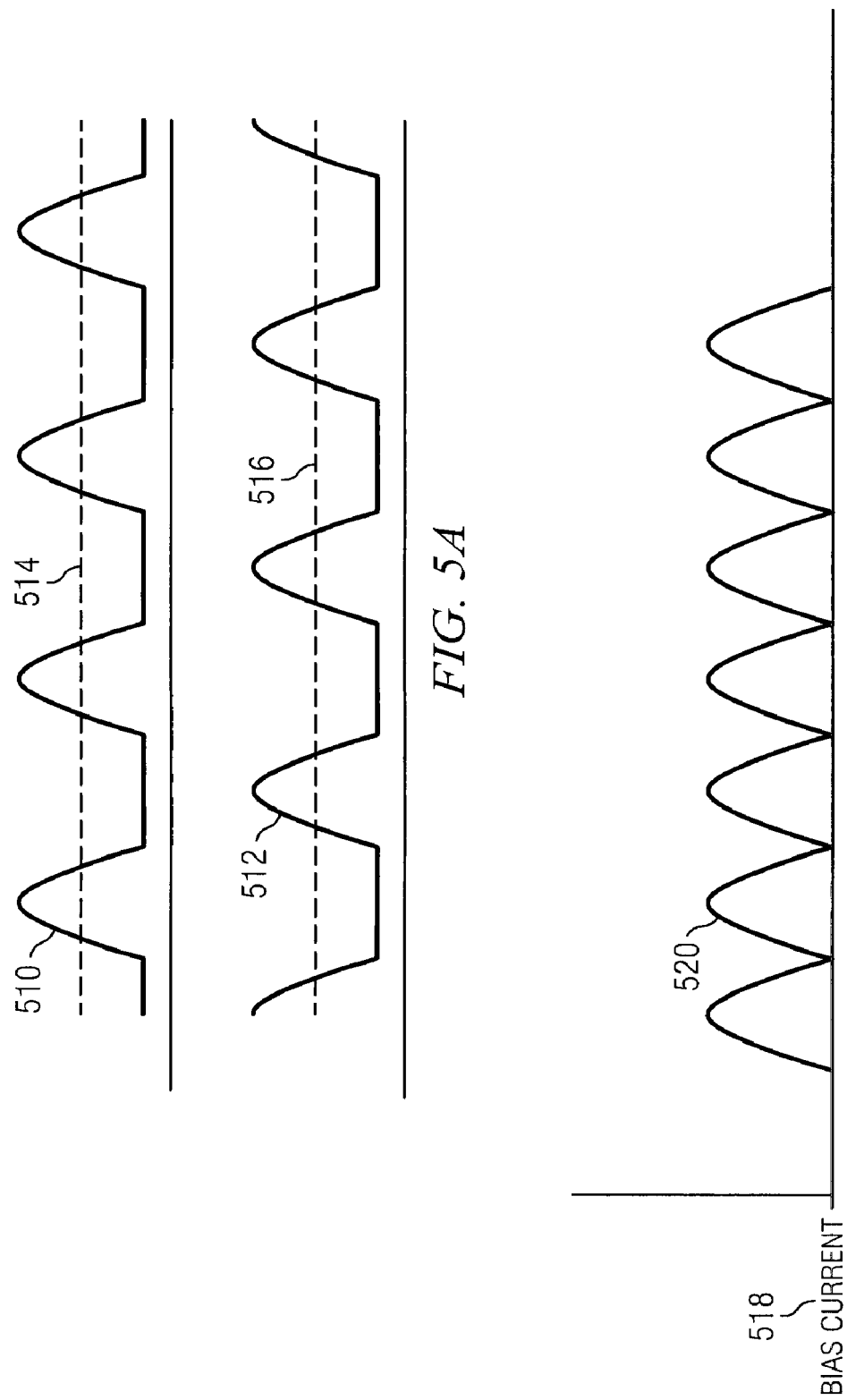

METHOD AND APPARATUS FOR BIASING AN AMPLIFIER

CLAIM OF DOMESTIC PRIORITY

The present application is a continuation of U.S. patent application Ser. No. 12/546,456, filed Aug. 24, 2009, now U.S. Pat. No. 7,944,302, and claims priority to the foregoing parent application pursuant to 35 U.S.C. §120.

FIELD OF THE INVENTION

The present invention relates in general to amplifiers and, more particularly, to measuring and modifying a bias current of an audio amplifier whether or not the audio amplifier is processing an audio signal.

BACKGROUND OF THE INVENTION

Audio amplifiers and speakers for entertainment systems can take a variety of forms. In one instance, for example, artists may interact with musical instruments, such as an electric guitar or an electric bass guitar, to generate electrical audio signals that are representative of the sounds produced by the instrument. Alternatively, the audio signals may instead be generated from vocals that are processed by a microphone. In any case, the electrical signals are routed through one or more audio amplifiers for pre-amplification, power amplification, filtering, and other signal processing to enhance the tonal quality and properties of the audio signal. The processed signals are then used to drive a speaker system to reproduce the original sound generated by the musical instrument or vocals.

While solid state electronic design continues to represent a popular paradigm within which many amplifier topologies are developed, vacuum-tube (tube) amplifier design continues to remain quite popular as well, especially with many audiophiles. Some audiophiles, for example, have become enamored with the unique sound that may be reproduced and amplified using tube amplifiers.

Perhaps the correspondence between electronic distortion and the resultant musical tone coloration produced by a tube amplifier may provide enlightenment as to the preference for tube amplification. The musical tone coloration, for example, of an audio signal may be determined by the strength of the first few harmonics of the audio signal's spectral composition. In particular, each of the lower harmonics may produce their own characteristic effect when dominant, or conversely, may modify the effect of another dominant harmonic when prominent.

Musically, the lower harmonics may be divided into two tonal groups: 1) the lower odd harmonics, e.g., the third and fifth harmonics, that produce a "stopped" or "covered" sound; and 2) the lower even harmonics, e.g., the second, fourth, and sixth harmonics, that produce a "choral" or "singing" sound. The second and third harmonics tend to be the most significant of all the lower harmonics with regard to the electronic distortion produced and, therefore, tend to be the most significant when determining the resultant musical tone coloration. Thus, the basic cause of the difference between the sound produced by tube amplification versus solid state amplification may be linked to the difference in harmonic weighting produced by the tube amplifier as compared to the transistor amplifier when each is operated in a saturated, or overloaded, state.

Transistor amplifiers, for example, exhibit a strong component of third harmonic distortion when saturated, which produces a "covered" sound having a restricted quality. Tube amplifiers, on the other hand, produce a large spectrum of harmonics when overloaded, especially the second, third, fourth, and fifth spectral components, which provides a full-bodied "brassy" quality to the sound produced.

The manner in which tube amplifiers are biased also contributes significantly to the sound quality that may be produced by the tube amplifier because the bias current, which is directly modulated by the control grid (grid) voltage, directly affects musical tone coloration. For example, an increasing magnitude of quiescent current, or bias current, conducted by the tube amplifier causes the output plate resistance and the input grid resistance of the tube amplifier to decrease. Since the harmonic content of the output signal generated by the tube amplifier is generally inversely proportional to plate resistance, an increase in bias current conducted by the tube amplifier produces a harmonically richer output signal. Accordingly, many audiophiles cannot resist the temptation to "hot bias" the tube amplifier, i.e., increase the bias current, so as to produce a richer sound.

Once an acceptable bias setting has been achieved, there exist many factors that may operate to change the bias setting. For example, individual tube characteristics, tube-to-tube variations in manufacturing, operational voltage magnitude, external component variations, etc., may affect the bias setting. In addition, the bias setting itself may have an adverse effect on tube life, whereby an increased bias current may decrease the life span of a vacuum tube contained within the tube amplifier. Thus, a user of a tube-based amplifier, such as an electric guitar amplifier, may have many occasions throughout the life span of the electric guitar amplifier to re-bias one or more tubes within the electric guitar amplifier.

Since acceptable operation of an electric guitar amplifier may be obtained over a relatively wide variation in bias settings of its constituent tube amplifiers, however, questions arise as to the frequency at which the bias settings should be adjusted. The ease by which the bias setting is adjusted also affects the frequency at which the bias settings should be adjusted, since most users do not possess the equipment or the expertise that is necessary to safely and correctly adjust the bias setting.

A need exists, therefore, to improve the ease and accuracy of the bias setting process so that optimum bias settings may be achieved to maintain optimal operation across a multitude of process and variation corners associated with vacuum tube operation.

SUMMARY OF THE INVENTION

In one embodiment, the present invention is an audio sound system comprising a first amplifier coupled to receive an audio signal and amplify the audio signal. A second amplifier is coupled to receive the audio signal and amplify the audio signal. A speaker is coupled to the first and second amplifiers for converting the amplified audio signal to audible sounds. A first current sense element is coupled in a conduction path of the first amplifier. A second current sense element is coupled in a conduction path of the second amplifier. A bias current detection circuit is coupled to the first and second current sense elements for detecting first and second bias current signals in the first and second amplifiers.

In another embodiment, the present invention is an audio sound system comprising a first amplifier coupled to receive an audio signal and amplify the audio signal. A first current sense element is coupled in a conduction path of the first amplifier. A bias current detection circuit is coupled to the first current sense element for detecting a first bias current signal in the first amplifier.

In another embodiment, the present invention is an audio sound system comprising an audio amplification stage coupled to receive an audio signal. A bias current detection circuit is coupled to the audio amplification stage for detecting a bias current signal.

In another embodiment, the present invention is a method of detecting bias current in an audio amplifier comprising the steps of processing a first audio signal through a first amplifier, routing the first amplified audio signal through a first current sense element coupled in a conduction path of the first amplifier, and detecting a first bias current signal in the first amplifier by isolating the first bias current from the first amplified audio signal.

BRIEF DESCRIPTION OF THE DRAWINGS

FIG. 5A illustrates various waveforms that are representative of test point signals generated by the push-pull amplifier stage of FIG. 4;

FIG. 5B illustrates a summation of the waveforms of FIG. 5A;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

In general, a method and apparatus is provided for the determination of the magnitude of bias current that is conducted by each amplifier of a given amplifier stage, which in one embodiment, is implemented as a push-pull pair. The individual bias current conducted by each amplifier of the push-pull pair is ascertained by conducting a series of measurements and executing a series of calculations based on the measurements.

Current measurements, for example, are taken from a current sensing element that corresponds to a conductivity state of each amplifier of a push-pull pair regardless of whether the push-pull pair is processing an input signal, or whether the push-pull pair is at idle. A first set of summation and difference terms are generated from the current measurements. The sum terms are further processed to determine the peak minima excursions of the sum terms, while the difference terms are averaged. A second set of summation and difference calculations are then performed on the first set of peak minima detected summation terms and the averaged difference terms to determine the individual bias current magnitudes for each amplifier of the push-pull pair.

In one embodiment, the bias current of each individual amplifier of the amplifier stage is automatically adjusted in response to the corresponding bias current magnitude measured for each individual amplifier. As a result, the adjusted bias current magnitude for each individual amplifier is made to conform to a pre-determined bias current setting using closed-loop feedback.

In an alternate embodiment, the bias current for each individual amplifier of the amplifier stage is controlled manually, whereby user-defined, i.e., external, bias current settings are utilized to adjust the bias current magnitude for each individual amplifier. As a result, the adjusted bias current magnitude for each individual amplifier is made to conform to an external bias current setting using closed-loop feedback.

Figure 1:
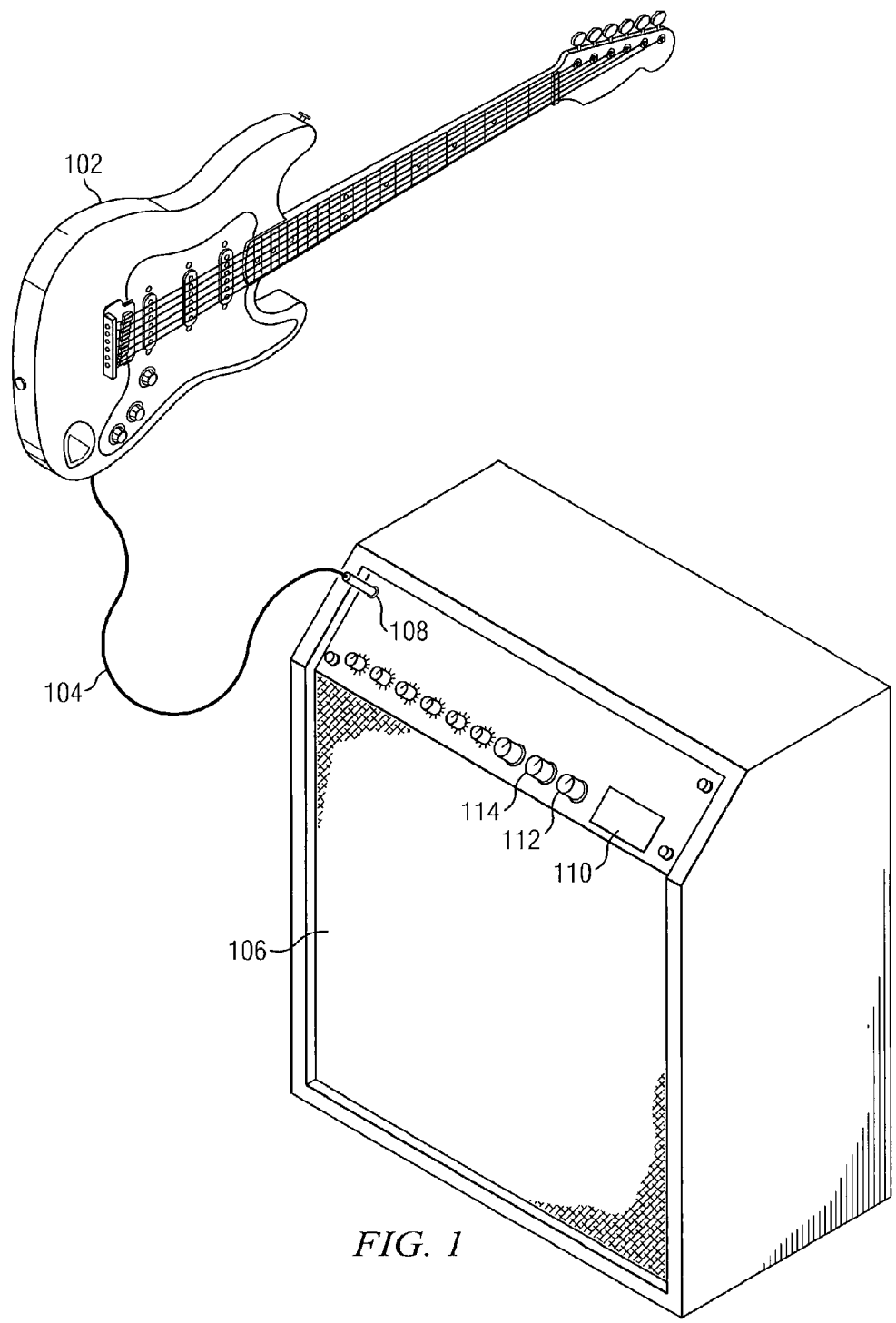
FIG. 1 illustrates a guitar connected to an audio sound system.

Referring to FIG. 1, a musical instrument such as electric guitar 102 is shown with an audio output cable 104. In other embodiments, the musical instrument may be an electric bass guitar, violin, drums, electric keyboard, audio microphone, or other instrument generating electrical signals that are representative of sound content. Electric guitar 102 generates an electrical signal representative of the sounds produced by electric guitar 102, which are then provided to audio amplifier 106 for signal conditioning and power amplification.

The electrical output of electric guitar 102, for example, is electrically connected to amplifier 106 by connecting audio cable 104 to audio input jack 108 on the front panel of audio amplifier 106. The signal conditioning provided by audio amplifier 106 may include amplification, equalization, filtering, special effects, and other signal processing functions that increase the power level and improve the signal properties of the audio signal that is provided to the speaker (not shown within audio amplifier 106).

Audio amplifier 106 also facilitates the measurement and modification of the individual bias current levels that are conducted by the individual amplifiers contained within audio amplifier 106. As discussed below in more detail, therefore, display 110 and bias voltage control knobs 112-114 may be provided in one embodiment to allow the user of the system exemplified in FIG. 1 to externally control and monitor the individual bias current conduction levels that are exhibited by the individual amplifiers contained within audio amplifier 106.

Figure 2:
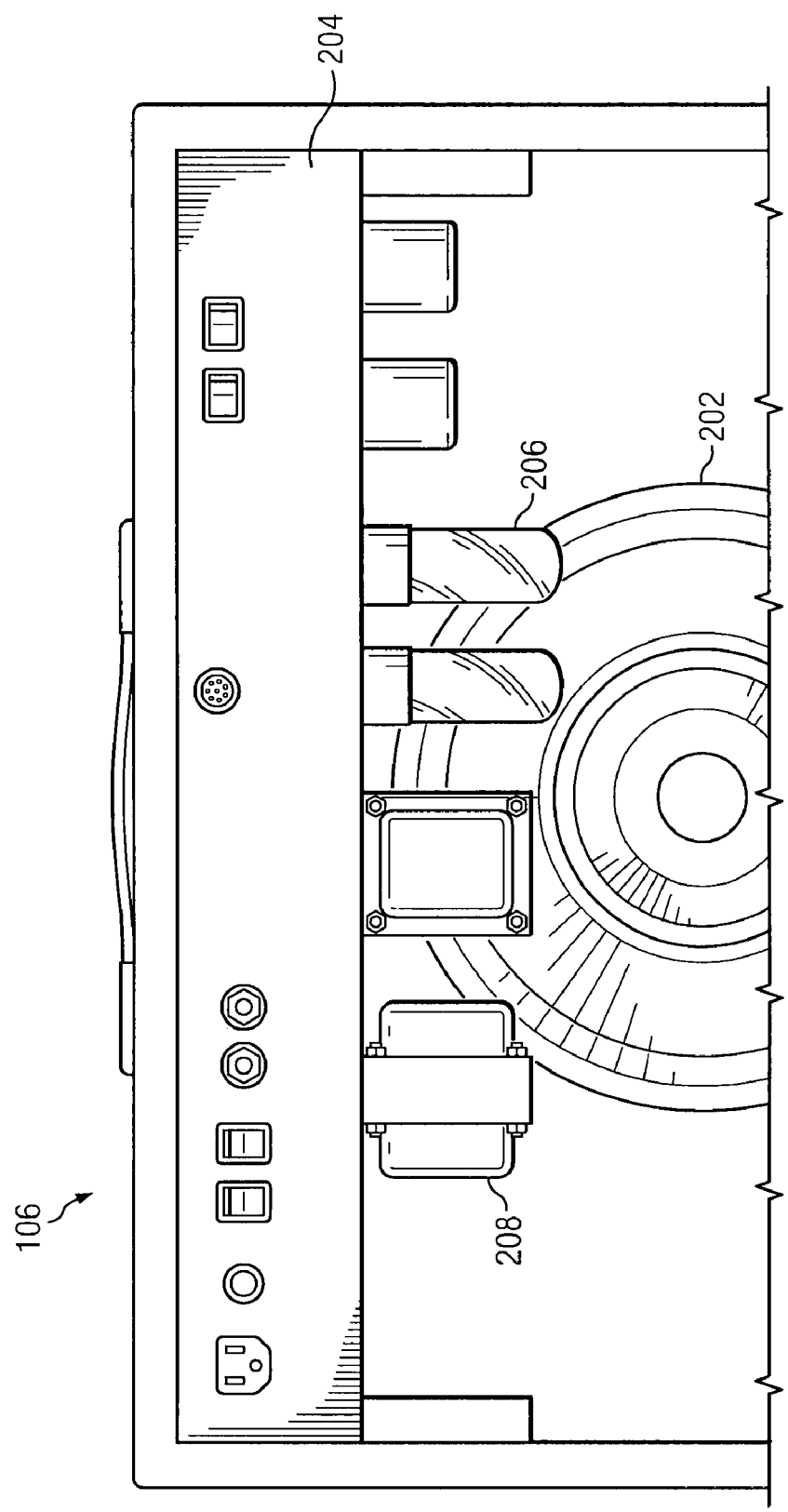
FIG. 2 illustrates an interior portion of the audio amplifier of FIG. 1.

Turning to FIG. 2, the interior portion of audio amplifier 106 is exemplified, whereby speaker 202 is co-located within the same enclosure as amplifier portion 204. In alternate embodiments, amplifier portion 204 may instead be separated into its own individual enclosure as well.

As illustrated in FIG. 2, vacuum tubes 206 are paired to form, for example, a push-pull amplifier pair, whereby a first tube amplifier of the push-pull pair amplifies the audio signal during a first half cycle of the audio signal and a second tube amplifier of the push-pull pair amplifies the audio signal during a second half cycle of the audio signal. In alternate embodiments, the push-pull implementation may be augmented with an even number of amplifier pairs, e.g., a first pair of parallel-connected tube amplifiers performing the "push" operation with a second pair of parallel-connected tube amplifiers performing the "pull" operation.

Transformer 208 is utilized within audio amplifier 106 to match the relatively high output impedance of the push-pull amplifier to the relatively low input impedance of speaker 202. For example, vacuum tubes 206 that may be used to implement a push-pull amplification stage are generally characterized as high-voltage, low-current devices. In contrast, speaker 202 is generally characterized as a low-voltage, high-current device. As a result, transformer 208 is utilized as a step-down transformer, whereby the high output impedance of the tube amplifier is substantially matched to the low input impedance of speaker 202 to facilitate a relatively efficient power transfer between the tube amplifier and speaker 202 via transformer 208.

Figure 3:
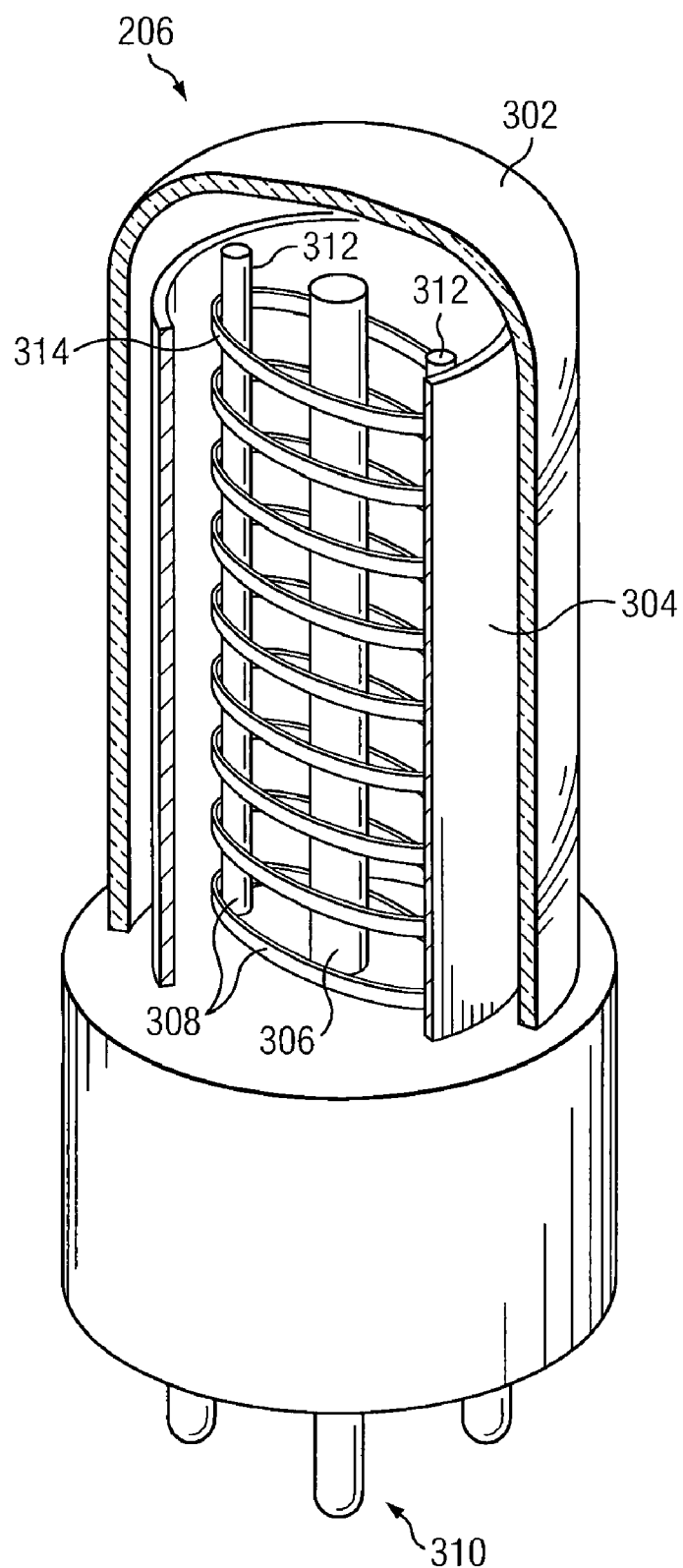
FIG. 3 illustrates a diagram of the physical attributes of an exemplary vacuum tube utilized within the audio amplifier of FIG. 1.

Turning to FIG. 3, a diagram of an exemplary vacuum tube 206 is illustrated, whereby vacuum tube 206 exemplifies a triode configuration, i.e., utilizing only a single control grid 308. In alternate embodiments, on the other hand, vacuum tube 206 may instead be implemented by a tetrode configuration, i.e., containing a second control grid (not shown) also known as a screen grid. Vacuum tube 206 may also be implemented by a pentode configuration, i.e., containing a third control grid (not shown) also known as a suppressor grid.

Control grid 308 is generally implemented using plated wire 314 that is wound around two soft metal posts 312. In smaller tubes, posts 312 may be comprised of copper. Grids in larger tubes, such as power tubes, generally must tolerate excessive heat; therefore, posts 312 may also be manufactured using tungsten or molybdenum. The plating used on plated wire 314 is generally gold, or some other metal, that is less prone to secondary emission.

Cathode 306 may be implemented, for example, as a thoriated filament or an oxide-coated filament. A thoriated filament consists of a tungsten filament that contains a small amount of thorium, which is a naturally occurring, slightly radioactive metal. The oxide-coated filament, on the other hand, may be a filament that is coated with a mixture of barium and strontium oxides and other substances. The oxide-coated filament may also be an indirectly-heated cathode, whereby a nickel tube coated with a mixture of barium and strontium oxides and other substances surrounds a heating filament. In either case, the cathode is heated to some elevated temperature, e.g., 500-1000 degrees C., which causes the cathode to emit electrons.

The electrons are collected on plate 304, also known as the anode, which serves as the electrode that supplies the output signal from tube 206. Since anode 304 accepts the electron flow, the temperature of anode 304 also tends to increase. Accordingly, anode 304 may be configured to radiate heat through glass envelope 302 as a heat dissipation measure, or conversely, may dissipate heat using forced-air or liquid cooling.

In operation, cathode 306 is heated so as to emit electrons that are subsequently collected by anode 304 to create current flow through tube 206. Anode 304 is typically biased to a relatively large magnitude of direct current (DC) voltage, which may range between, e.g., 50 and 500 volts. As a result, anode 304 is highly attractive to the electrons emitted by cathode 306. In order to regulate the magnitude of current flow through tube 206, therefore, a negative DC bias voltage, e.g., −6 to −60 volts, is applied to grid 308.

Thus, by applying a DC bias voltage to grid 308 and a relatively high DC voltage to plate 304, a quiescent (bias) current may be created within tube 206 that is generally conducted by anode 304 and cathode 306. Operation of tube 206 further allows the application of an alternating current (AC) signal, which as discussed in more detail below, may be an audio signal generated by electric guitar 102 of FIG. 1 that further modulates grid 308. The anode, cathode, and grid signals provided/received to/from tube 206 may be facilitated via pins 310 of tube 206, which electrically couple to the corresponding anode 304, cathode 306, and grid 308 contained within tube 206.

Generally speaking, there exists no single "correct" bias current magnitude that may be conducted by tube 206. Rather, a range of acceptable bias current magnitudes between an upper limit and a lower limit may be conducted by tube 206 depending upon the user's preference. The upper limit of bias current magnitude should be selected so as to avoid exceeding the maximum power dissipation limit at plate 304 throughout the dynamic range of tube 206. The lower limit of bias current magnitude should be selected so as to avoid excessive cross-over distortion, which produces deleterious effects on the perceived sound quality of audio signals processed by tube 206.

Accordingly, measurement and modification of the magnitude of a bias current signal that is conducted by a tube amplifier is facilitated. Furthermore, measurement and modification of the bias current of the tube amplifier may be executed whether the tube amplifier is idle, or is actively processing an audio signal. Still further, measurement and modification of the bias current conducted by individual tube amplifiers may be facilitated on two or more tube amplifiers that may be collectively operating within any given amplification stage. As a result, bias current signal magnitudes may be generated independently for each tube amplifier in the amplification stage, so as to facilitate an individually programmable bias current selection for each tube amplifier in operation.

Figure 4:
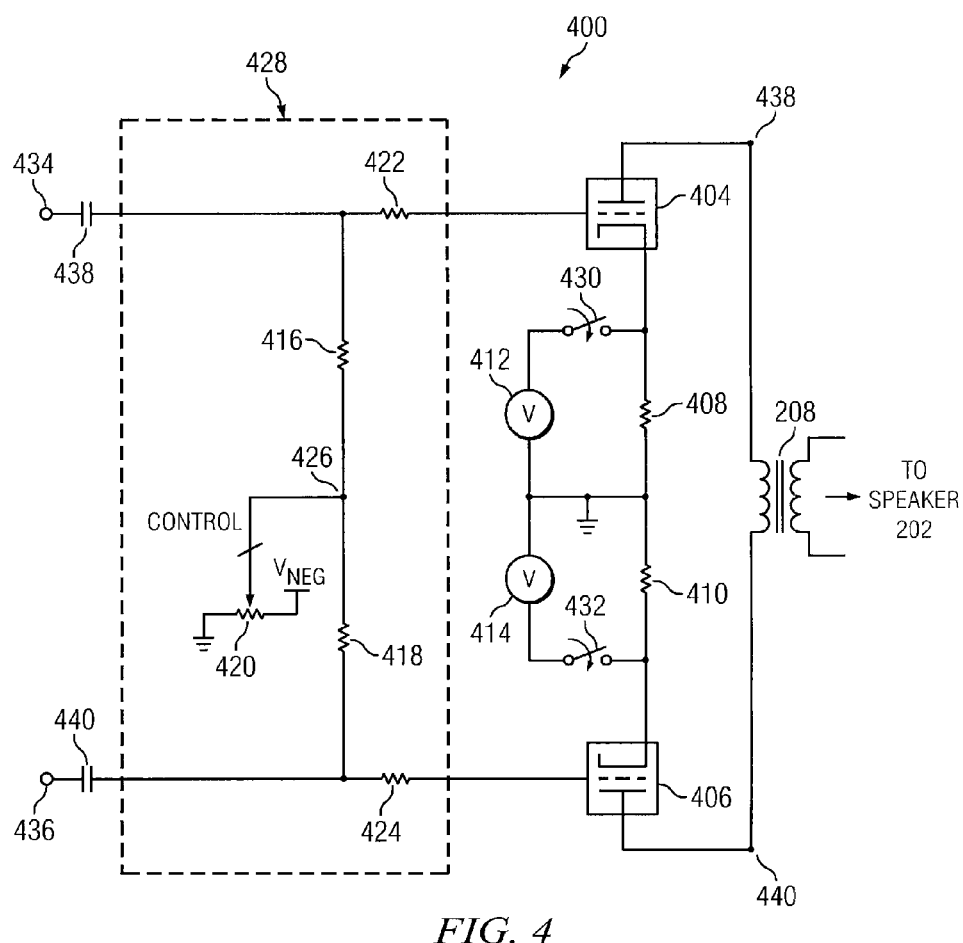
FIG. 4 illustrates a schematic diagram of a push-pull amplifier stage utilizing vacuum tubes as exemplified in FIG. 3.

Turning to FIG. 4, an exemplary schematic diagram of a typical tube-amplifier output stage 400 is illustrated, whereby tube amplifiers 404-406 are implemented in a push-pull configuration. The anode terminals of tube amplifiers 404-406 are coupled to opposite terminals 438 and 440 of the primary winding of transformer 208 as illustrated. The cathode terminals of tube amplifiers 404 and 406 are coupled through resistive components 408 and 410, respectively, to a reference voltage potential, e.g., ground potential, as illustrated.

In one embodiment, the grid terminals of tube amplifiers 404 and 406 are coupled together via resistive components 416-424, as illustrated, to provide a programmably selectable bias voltage to each respective control grid of tube amplifiers 404 and 406. In an alternate embodiment (not shown in FIG. 4), separate bias voltages may instead be provided to each respective control grid individually, so as to independently control the bias voltage that is applied to the control grid of tube amplifiers 404 and 406 separately.

In operation, a voltage signal is applied to node 426, so as to generate the grid bias voltage at the grid terminals of tubes 404 and 406 via voltage dividers 416/422 and 418/424, respectively. In one embodiment, a single potentiometer (or equivalent) 420 may be utilized to programmably select (via signal CONTROL) the variable grid bias voltage between a first reference voltage, e.g., ground potential, and a second reference voltage, $V_{NEG}$, as illustrated. In an alternate embodiment (not shown in FIG. 4), two potentiometers (or their equivalents) may instead be utilized to programmably select the variable grid bias voltages for each tube amplifier 404 and 406 separately.

In other embodiments, a DC-DC converter may instead be utilized to programmably select, via signal CONTROL, the variable grid bias voltage that is applied to the control grid terminals of tube amplifiers 404 and 406. For example, a switch-mode DC-DC converter, such as a pulse width modulator (PWM), may be utilized. In operation, a DC source voltage is first converted to an AC signal having a duty cycle. Through manipulation of the duty cycle, via signal CONTROL, the magnitude of the DC voltage produced at the output of the PWM may be programmed to select an appropriate magnitude of grid bias voltage at the control grid terminals of tube amplifiers 404 and 406.

The bias current conducted by tube amplifiers 404 and 406, in response to the grid bias voltage generated at their respective control grid terminals, may be ascertained by indirectly measuring the cathode current conducted by tube amplifiers 404 and 406. In other words, measurement of the voltage magnitude existing across resistive components 408 and 410, respectively, indirectly yields the magnitude of bias current conducted by the cathode of tube amplifiers 404 and 406, respectively. In one embodiment, resistive components 408 and 410 each exhibit a resistance magnitude of, e.g., 1 ohm, such that for each millivolt measured across resistive components 408 and 410 by voltage meters 412 and 414, respectively, one milliamp of bias current is also measured.

For example, a 30 mV measurement across resistive components 408 and 410, as may be optionally facilitated by switches 430 and 432, respectively, substantially indicates a 30 mA bias current conducted by the cathode of tube amplifiers 404 and 406, respectively. Since no appreciable current flows in the control grid of tube amplifiers 404 and 406, the plate current is also deemed to be substantially equal to 30 mA in this example as well.

As discussed in more detail below, however, the presence of an AC signal on the grid terminals of tube amplifiers 404 and 406 may significantly affect the bias current measurements. Techniques are employed, therefore, to substantially negate the effects of the AC signal, thereby facilitating accurate bias current measurements even when taken in the presence of an AC signal.

The AC signal, for example, may be generated by musical instrument 102 of FIG. 1 to be eventually provided at nodes 434 and 436 by a pre-amplification stage (not shown). The pre-amplification stage is capacitively coupled, i.e., AC coupled, to grid bias generation block 428 via capacitive elements 442 and 444. The audio signal is then amplified by the push-pull configuration implemented by tube amplifiers 404 and 406 and applied to transformer 208 for eventual processing by speaker 202.

Turning to FIG. 5A, waveform 510 exemplifies the signal that may be generated at the cathode terminal of tube amplifier 404 operating as a Class AB amplifier in response to the audio signal provided at node 434 as well as the bias voltage that is provided by grid bias generation block 428. Similarly, waveform 512 exemplifies the signal that may be generated at the cathode terminal of tube amplifier 406 operating as a Class AB amplifier in response to the audio signal present at node 436 as well as the bias voltage that is provided by grid bias generation block 428. It is noted that while waveforms 510 and 512 may be measured at the anode terminals of tube amplifiers 404 and 406, cathode terminal measurements are instead taken across resistive elements 408 and 410 as illustrated so as to avoid the relatively high DC voltage magnitudes present at the anode terminals of tube amplifiers 404 and 406.

As can be verified by inspection of the waveforms of FIG. 5A, each of waveforms 510 and 512 comprise three components: 1) the DC bias components that are representative of the bias voltages present at the grid terminals of tube amplifiers 404 and 406, respectively; 2) the AC components, e.g., 510 and 512, that are representative of the time-varying amplified audio signals; and 3) the DC audio components, e.g., 514 and 516, that are representative of the average of the time-varying amplified audio signals 510 and 512.

Since both waveforms of FIG. 5A include two DC components, i.e., a first DC component generated by the bias signal and a second DC component generated by the audio signal, it is verified by inspection that the DC voltage magnitude, as measured by voltage meters 412 and 414, may vary significantly depending upon whether tube amplifiers 404 and 406 are processing audio signals. As a result, the bias current measurements may yield erroneous results due to the presence of the audio signal.

For example, the bias current magnitude, as indirectly measured by voltage meters 412 and 414, includes both respective DC components, i.e., 514 and 516, when tube amplifiers are processing audio signals. As a result, the measured bias current magnitudes do not yield accurate results. Specific measurement and calculation techniques, therefore, must be implemented, so as to substantially eliminate the effects of the error voltage terms, i.e., 514 and 516, when tube amplifiers 404 and 406 are processing audio signals.

The bias signals, as measured at the cathode terminals of tube amplifiers 404 and 406, are therefore transformed to yield accurate bias current measurements regardless of signal drive. That is to say, in other words, that notwithstanding the presence of DC audio components, e.g., 514 and 516 resulting from AC audio components 510 and 512, the DC bias components that are indicative of the actual bias current magnitudes conducted by tube amplifiers 404 and 406, respectively, may nevertheless be accurately measured.

Turning to FIG. 5B, waveform 520 is exemplified, which is proportional to the summation of waveforms 510 and 512. It can be shown, that the minima peaks of waveform 520 are proportional in magnitude to bias current 518, which represents the actual magnitude of bias current that is conducted by tube amplifiers 404 and 406. When the resistance magnitude of resistive components 408 and 410 substantially equals 1 ohm, then the minima peaks of waveform 520 are substantially equal in magnitude to bias current 518.

A summation device (or equivalent) is therefore utilized to form a summation of waveforms 510 and 512. Utilization of a minima peak detector on the summation is then effective to yield an accurate measurement of the magnitude of bias current 518 even in the presence of an audio signal.

In addition, the difference between waveforms 510 and 512 may also be obtained. Utilization of an averaging process on the difference is then effective to remove all AC components. Further manipulation of the minima peak detected sum term and the averaged difference term yields accurate calculations for the magnitude of the individual bias current signals that are conducted by each of the respective tube amplifiers that may be operating within a given amplification stage.

For example, if the summation/minima peak detection operation yields a value of, e.g., 60 mV, and the average difference yields a value of, e.g., 0 mV, then each tube amplifier 404 and 406 are determined to be conducting 30 mA of bias current. If, on the other hand, the summation/minima peak detection operation yields a value of, e.g., 80 mV, and the average difference yields a value of, e.g., −2 mV, then one of tube amplifiers 404 and 406 is determined to be conducting 39 mA of bias current while the other is determined to be conducting 41 mA of bias current.

Figure 6A:
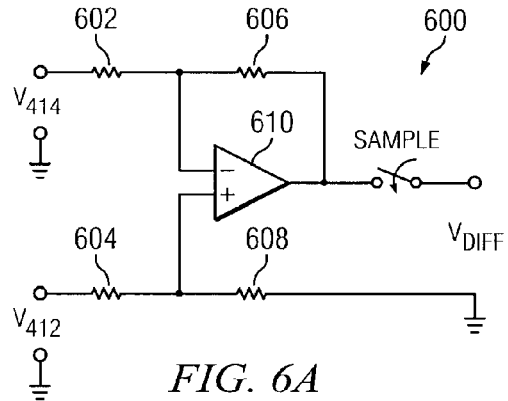
FIG. 6A illustrates a schematic diagram of a difference circuit.

Turning to FIG. 6A, a schematic diagram of an exemplary difference circuit 600 is illustrated, which in one embodiment, may be used to take the difference between waveforms 510 and 512 as discussed above. Nodes $V_{412}$ and $V_{414}$ represent the voltages as measured by voltage meters 412 and 414, respectively, of FIG. 4, which are further exemplified by waveforms 510 and 512 of FIG. 5A. Resistive components 602-604 exhibit equivalent resistance magnitudes with respect to each other and resistive components 606-608 exhibit equivalent resistance magnitudes with respect to each other. It can be shown that equation (1) describes the expression for $V_{DIFF}$ as follows:

$$V_{DIFF} = \frac{R_{606}}{R_{602}}[V_{412} - V_{414}], \quad (1)$$

where $V_{DIFF}$ is the output voltage of operational amplifier 610, $V_{414}$ is the voltage measured by voltage meter 414 of FIG. 4, $V_{412}$ is the voltage measured by voltage meter 412 of FIG. 4, $R_{606}$ is the resistance magnitude of resistive component 606, and $R_{602}$ is the resistance magnitude of resistive component 602. By further selecting the resistance magnitudes of resistive components 606 and 602 to be equal, equation (1) is simplified to yield the difference between $V_{412}$ and $V_{414}$ as described in equation (2):

$$V_{DIFF} = [V_{412} - V_{414}]. \quad (2)$$

It is recognized that signal $V_{DIFF}$ may be sampled over time to obtain time-indexed values. In such an instance, a digital sample set may be obtained, whereby an expression for signal $V_{DIFF}$ may be calculated and averaged from the digital sample set. It is further recognized that averaging the difference results of equation (2) effectively "strips" audio components 510, 512, 514, and 516 away. Thus, equation (2) expresses only the difference in the DC bias current magnitude that is conducted by tube amplifiers 404 and 406.

Figure 6B:
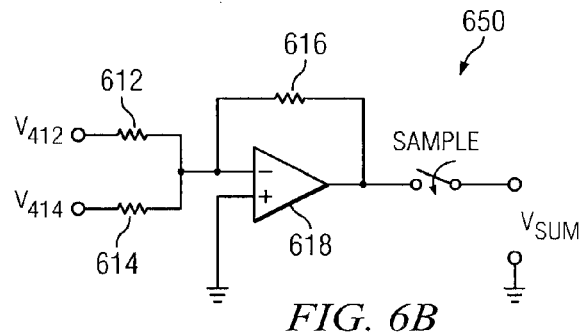
FIG. 6B illustrates a schematic diagram of a summation circuit.

Turning to FIG. 6B, a schematic diagram of an exemplary summation circuit 650 is further illustrated, which in one embodiment, may be used to sum waveforms 510 and 512 as discussed above. Nodes $V_{412}$ and $V_{414}$ represent the voltages as measured by voltage meters 412 and 414, respectively, of FIG. 4, which are further exemplified by waveforms 510 and 512 of FIG. 5A. It can be shown that equation (3) describes the expression for $V_{SUM}$ as follows:

$$V_{SUM} = -\left(\frac{R_{616}}{R_{612}}V_{412} + \frac{R_{616}}{R_{614}}V_{414}\right), \quad (3)$$

where $V_{SUM}$ is the output voltage of operational amplifier 618, $V_{414}$ is the voltage measured by voltage meter 414 of FIG. 4, $V_{412}$ is the voltage measured by voltage meter 412 of FIG. 4, $R_{616}$ is the resistance magnitude of resistive component 616, $R_{614}$ is the resistance magnitude of resistive component 614, and $R_{612}$ is the resistance magnitude of resistive component 612. By further selecting the resistance magnitudes of resistive components 612-616 to be equal, equation (3) is simplified to yield the summation of $V_{414}$ and $V_{412}$, as described in equation (4):

$$V_{SUM} = -(V_{412} + V_{414}). \quad (4)$$

It is recognized that signal $V_{SUM}$ may be inverted and sampled over time to obtain non-negative, time-indexed values of the summation of waveforms 510 and 512. In such an instance, a digital sample set may be obtained, whereby an expression for signal $V_{SUM}$ may be calculated from the digital sample set.

Figure 6C:
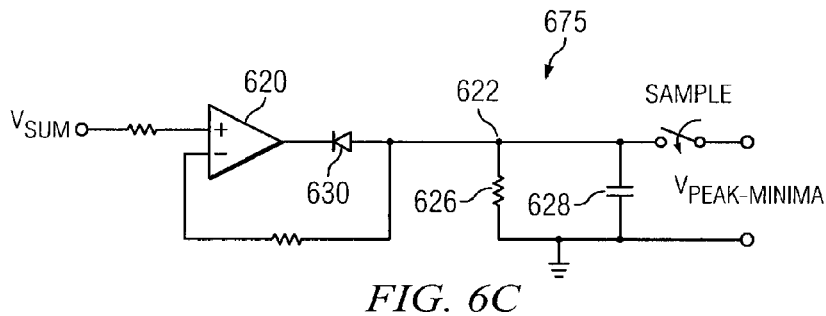
FIG. 6C illustrates a schematic diagram of a minima peak detection circuit.

Turning to FIG. 6C, a schematic diagram of an exemplary minima peak detection circuit 675 is further illustrated. Node $V_{SUM}$ represents the non-sampled, inverted voltage output of summation circuit 650 of FIG. 6B, which is further exemplified by summation waveform 520 of FIG. 5B. By operation of diode 630, voltage output excursions provided by operational amplifier 620 that exceed the voltage at node 622 are blocked, since diode 630 is non-conductive during those periods. As a result, only those voltage output excursions provided by operational amplifier 620 that do not exceed the voltage at node 622 are allowed to charge capacitive element 628.

After several cycles of summation waveform 520 have been processed by minima peak detection circuit 675, the voltage across capacitor 628, $V_{PEAK-MINIMA}$, is approximately equal to the voltage magnitude of the minima peaks of summation waveform 520. Stated differently, the magnitude of voltage across capacitor 628 asymptotically approaches the magnitude of bias current 518, as conducted by tube amplifiers 404 and 406, assuming that the resistance magnitude of resistive components 408 and 410 is substantially equal to 1 ohm. The time constant as set by resistive component 626 and capacitive component 628, however, should be large enough so as to avoid excessive decay of signal $V_{PEAK-MINIMA}$ during the non-conductive periods of diode 630.

It is recognized that signal $V_{PEAK-MINIMA}$ may be sampled over time to obtain time-indexed values. In such an instance, a digital sample set may be obtained, whereby an expression for signal $V_{PEAK-MINIMA}$ may be calculated from the digital sample set. It is further recognized that waveform 520 is rectified and filtered by operation of minima peak detection circuit 675, such that signal $V_{PEAK-MINIMA}$ represents only that portion of signal $V_{SUM}$ that is indicative of the DC bias current magnitude, bias current 518, that is conducted by tube amplifiers 404 and 406 collectively. Additional manipulation of signal, $V_{PEAK\_MINIMA}$, and the average value of signal, $V_{DIFF}$, further allows the calculation of the magnitudes of the individual bias current signals that are flowing through each of tube amplifiers 404 and 406 separately.

In particular, by taking the sum of term, $V_{PEAK\_MINIMA}$, and the average of term, $V_{DIFF}$, as described in equation (5), a determination of the magnitude of the bias current, $IBIAS_{404}$, flowing through tube amplifier 404 may be found:

$$IBIAS_{404} = 0.5*[V_{PEAK\_MINIMA} + V_{DIFF}] = 0.5*[V_{412}' + V_{414}' + V_{412}' - V_{414}']0.5*[2*IBIAS_{404}] \quad (5)$$

assuming that the resistance magnitude of resistive elements 408 and 410 is equal to 1 ohm. As discussed above, signals $V'_{412}$ and $V'_{414}$ are stripped of the AC and DC signal components of the audio signal being processed by tube amplifiers 404 and 406. As a result, signals $V'_{412}$ and $V'_{414}$ are indicative of the respective bias current signals, $IBIAS_{404}$ and $IBIAS_{406}$, that are conducted by tube amplifiers 404 and 406, respectively.

By further taking the difference between term, $V_{PEAK\_MINIMA}$, and the average of term, $V_{DIFF}$, as described in equation (6), a determination of the magnitude of the bias current, $IBIAS_{406}$, flowing through tube amplifier 406 may be found:

$$IBIAS_{406} = 0.5*[V_{PEAK\_MINIMA} - V_{DIFF}] = 0.5*[V_{412}' + V_{414}' - V_{412}' + V_{414}'] = 0.5*[2*IBIAS_{406}], \quad (6)$$

assuming that the resistance magnitude of resistive elements 408 and 410 is equal to 1 ohm.

Figure 7:
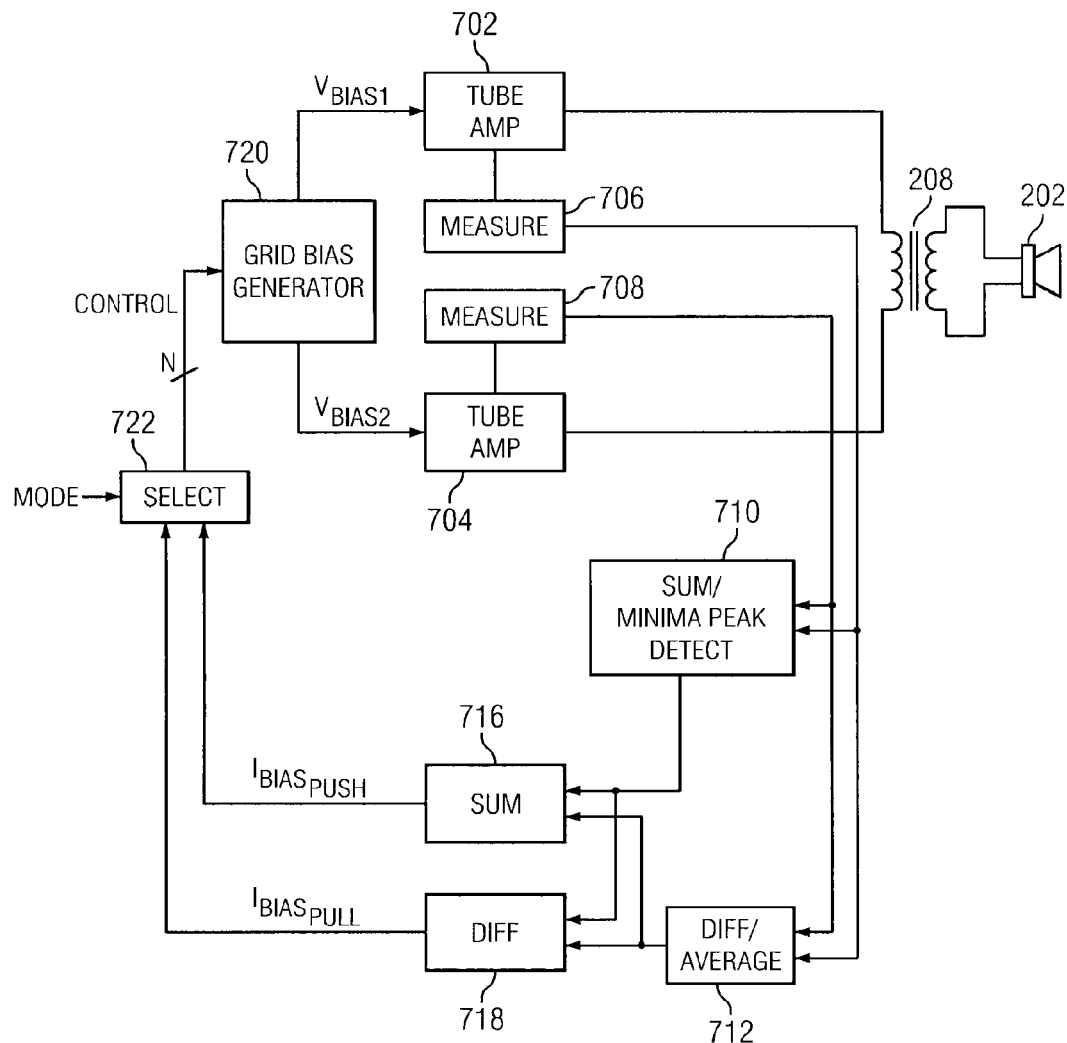
FIG. 7 illustrates a block diagram of a bias current control circuit for the push-pull amplifier stage of FIG. 4.

Turning to FIG. 7, a block diagram of a bias current control circuit is illustrated, whereby grid bias generator 720 generates multiple grid bias voltage signals, e.g., $V_{BIAS1}$ and $V_{BIAS2}$, that are applied to the control grids of tube amplifiers 702 and 704, respectively, in response to signals $CONTROL_1$ and $CONTROL_2$. In a first embodiment, for example, signal MODE selects an automatic mode of operation, such that signals $CONTROL_1$ and $CONTROL_2$ are automatically generated by select block 722 in response to signals $IBIAS_{PUSH}$ and $IBIAS_{PULL}$ that are generated by sum/minima peak detect block 710, difference/average block 712, sum block 716 and difference block 718.

For example, signal $IBIAS_{PUSH}$ is generated by sum block 716, which implements summation equation (5), where the $V_{PEAK\_MINIMA}$ term and the average of the $V_{DIFF}$ term are generated by sum/minima peak detect block 710 and difference/average block 712, respectively, in accordance with equations (4) and (2), respectively, using voltage measurements taken by blocks 706 and 708. Similarly, signal $IBIAS_{PULL}$ is generated by difference block 718, which implements difference equation (6), where the $V_{PEAK\_MINIMA}$ term and the average of the $V_{DIFF}$ term are generated by sum/minima peak detect block 710 and difference/average block 712, respectively, in accordance with equations (4) and (2) respectively, using voltage measurements taken by blocks 706 and 708.

In a second embodiment, signal MODE selects a manual mode of operation such that signals $CONTROL_1$ and $CONTROL_2$ may be manually generated by the user of audio amplifier 106. In particular, audio amplifier 106 may report the magnitude of bias current signals, $IBIAS_{PUSH}$ and $IBIAS_{PULL}$, onto display 110 of FIG. 1. In response, the user of audio amplifier 106 may manually rotate one or more bias voltage control knobs 112-114 to select the magnitude of one or more signals $CONTROL_N$ in order to modify the magnitude of one or more bias current signals, e.g., $IBIAS_{PUSH}$ and $IBIAS_{PULL}$.

The user may, therefore, obtain accurate measurements of the bias current being conducted by the tube amplifiers of audio amplifier 106 regardless of the existence of an audio signal. The user may also accurately modify the magnitude of the bias current being conducted by each tube amplifier of audio amplifier 106 while being continuously updated as to the magnitude of the individual bias current signals being conducted.

For example, the user may rotate bias voltage control knob 112 to select a magnitude of signal $CONTROL_1$, which is then effective to select the magnitude of signal $V_{BIAS1}$. As a result, the magnitude of $IBIAS_{PUSH}$ may be controlled by the user via bias voltage control knob 112. Similarly, the user may rotate bias voltage control knob 114 to select a magnitude of signal $CONTROL_2$, which is then effective to select the magnitude of signal $V_{BIAS2}$. As a result, the magnitude of $IBIAS_{PULL}$ may be controlled by the user via bias voltage control knob 114.

In alternate embodiments, a single voltage control knob may be utilized to select the magnitude of bias voltage that is applied to the grid terminals of tube amplifiers 702 and 704 simultaneously, as discussed above in relation to grid bias generation block 428 of FIG. 4. In such an instance, the magnitude of $IBIAS_{PUSH}$ and $IBIAS_{PULL}$ may be controlled simultaneously via a single voltage control knob.

Sum block 716, sum/minima peak detect block 710, difference/average block 712, and difference block 718 are exemplified as being implemented via operational amplifier circuits 650, 600, and 675 as discussed above. It is understood, however, that other analog circuits, digital circuits, or a combination of digital hardware and software-based processing may also be employed.

Figure 8:
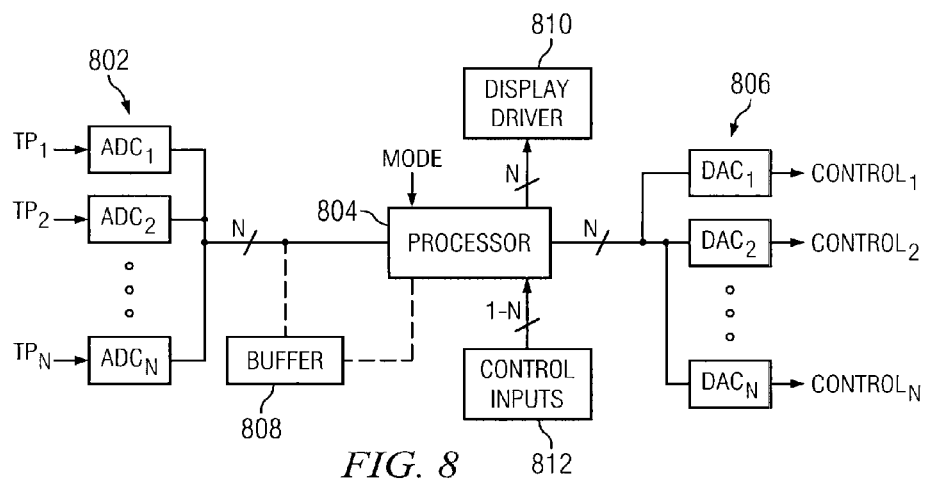
FIG. 8 illustrates a block diagram of a processing system that may be utilized within the bias current control circuit of FIG. 7.

Turning to FIG. 8, for example, an exemplary block diagram of a processing system that employs both analog and digital hardware, as well as software-based processing, is illustrated. Analog-to-digital converters (ADCs) 802 may, for example, be employed to selectively receive and convert any one of a number of analog test point signals, $TP_1$-$TP_N$, to their corresponding digital representations. Measurement blocks 706 and 708, as discussed above in relation to FIG. 7, for example, may be employed to furnish the analog test point signals, $TP_1$-$TP_N$. In one embodiment, test point signals, $TP_1$-$TP_N$, represent current measurements taken from the sensing elements of the respective amplifiers of a given amplification stage to determine a conductivity state of each of the respective amplifiers of a given amplification stage.

Buffer 808 may be optionally employed to provide storage for one or more groups of samples taken from measurement blocks 706-708 via ADCs 802, so as to off-load processor 804 from the commensurate overhead required of such real-time operations. Conversely, processor 804 may instead be employed to process samples from ADCs 802 in real time without the use of buffer 808.

In either instance, the sum, difference, average, and/or minima peak detection operations, as discussed above in relation to blocks 710-718, may instead be implemented by processor 804 through a succession of calculations that may be executed as defined by instructions executing within processor 804.

Once calculated, the relevant bias current magnitude information may then be transformed to be compatible with display 110 via display driver 810. Display driver 810 may then provide the transformed information to display 110 of FIG. 1 for viewing by the user.

If automatic operation is selected via signal MODE, then processor 804 also generates signals $CONTROL_1$-$CONTROL_N$ via, e.g., digital-to-analog converters (DACs) 806, in response to signals $TP_1$-$TP_N$. In particular, processor 804 may determine the appropriate magnitude of signals $CONTROL_1$-$CONTROL_N$ that are required in order to generate the required magnitudes of signals that are present at test points, $TP_1$-$TP_N$, through closed-loop feedback operation.

For example, the signal at $TP_1$ may represent the voltage across the sensing element corresponding to tube amplifier 702 and may, therefore, be indicative of the conductive state of tube amplifier 702 of FIG. 7. Signal $CONTROL_1$ may be representative of the corresponding control grid bias voltage, e.g., $VBIAS_1$. If $IBIAS_{PUSH}$, as calculated by processor 804, is below a predetermined threshold magnitude then processor 804 may modify the magnitude of signal $CONTROL_1$ so as to make the magnitude of signal $VBIAS_1$ less negative, thereby effecting an increase in the magnitude of $IBIAS_{PUSH}$. If, on the other hand, $IBIAS_{PUSH}$ is above a predetermined threshold magnitude, then processor 804 may modify the magnitude of signal $CONTROL_1$ so as to make the magnitude of signal $VBIAS_1$ more negative, thereby effecting a decrease in the magnitude of $IBIAS_{PUSH}$. The magnitude of $IBIAS_{PULL}$ may be similarly modified through closed-loop feedback operation.

If manual operation is selected via signal MODE, on the other hand, then processor 804 generates signals $CONTROL_1$-$CONTROL_N$ via, e.g., digital-to-analog converters (DACs) 806, in response to control inputs 812 received from, e.g., bias voltage control knobs 112-114. In particular, processor 804 may determine the appropriate magnitude of signals $CONTROL_1$-$CONTROL_N$ that are required in order to generate the required bias current magnitudes as programmed by bias voltage control knobs 112-114.

For example, the control voltage generated by bias voltage control knob 112 may represent the magnitude of bias current, e.g., $IBIAS_{PUSH}$, that is required to be conducted by tube amplifier 702 of FIG. 7. Signal $CONTROL_1$ may represent the actual control grid bias voltage, e.g., $VBIAS_1$, that is applied to amplifier 702. If the commanded magnitude of $IBIAS_{PUSH}$ is below the measured magnitude of $IBIAS_{PUSH}$, as calculated by processor 804, then processor 804 may modify the magnitude of signal $CONTROL_1$ so as to make the magnitude of signal $VBIAS_1$ less negative, thereby effecting an increase in the magnitude of $IBIAS_{PUSH}$ to substantially equal the commanded magnitude of $IBIAS_{PUSH}$ through closed-loop feedback operation. If, on the other hand, the commanded magnitude of $IBIAS_{PUSH}$ is above the measured magnitude of $IBIAS_{PUSH}$, as calculated by processor 804, then processor 804 may modify the magnitude of signal $CONTROL_1$ so as to make the magnitude of signal $VBIAS_1$ more negative, thereby effecting a decrease in the magnitude of $IBIAS_{PUSH}$ to substantially equal the commanded magnitude of $IBIAS_{PUSH}$ through closed-loop feedback operation. The magnitude of $IBIAS_{PULL}$ may be similarly modified through closed-loop feedback operation.

In alternate embodiments, processor 804 may utilize software-based processing to determine whether bias adjustments should be effected at all. In certain instances, such as is the case during, e.g., tube amplifier clipping, the bias current signal magnitudes as measured by processor 804 may indicate that a corresponding change in bias control voltage is necessary. Tube amplifier clipping, however, often results in harmonic distortion that produces a musical tone coloration that is preferred. In such instances, therefore, the bias correction that would ordinarily occur through operation of processor 804 may be programmably bypassed in favor of the preferred sound that is produced by the over-drive condition. Once the over-drive condition subsides, automatic/manual bias control operation of processor 804, as discussed above, may be programmably reinstated.

Figure 9:
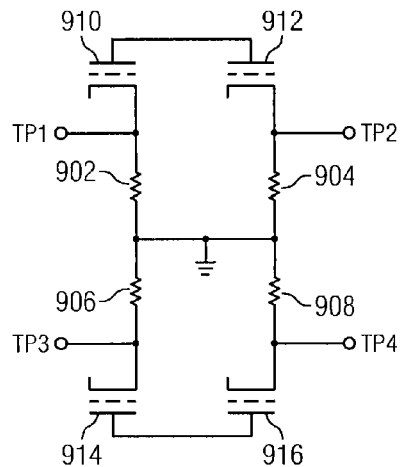
FIG. 9 illustrates an alternate embodiment of a push-pull amplification stage.

In some instances, the drive current capability of the push-pull implementation of the final amplification stage of FIGS. 4 and 7 may be augmented by placing multiple tube amplifiers, e.g., two tube amplifiers, in parallel as illustrated in FIG. 9. The bias current that is conducted by each of tube amplifiers 910-916 individually may nevertheless be similarly measured and calculated.

For example, the voltages measured at test points, $TP_1$-$TP_4$, are indicative of the conductivity state of tube amplifiers 910-916, respectively. As a result, the voltage measured at $TP_1$, $V_{TP1}$, is indicative of the current conducted by tube amplifier 910. Similarly, the voltage measured at $TP_3$, $V_{TP3}$, is indicative of the current conducted by tube amplifier 914.

Using the mathematical relationships discussed above, the magnitude of each individual bias current signal may be determined as follows. First, the minima peak detected sum term and the averaged difference term for each push-pull pair are measured and calculated through any of a number of analog, digital, and/or software-based implementations, as discussed above, in accordance with equations (7) and (8):

$$SUM = V_{TP1} + V_{TP3} = I_{TP1} + I_{TP3} = BiasCurrent_{910} + BiasCurrent_{914} \quad (7)$$

$$DIFF = V_{TP1} - V_{TP3} = I_{TP1} - I_{TP3} = BiasCurrent_{910} - BiasCurrent_{914}, \quad (8)$$

where $BiasCurrent_{910}$ and $BiasCurrent_{914}$ are the respective bias current signals conducted by tube amplifiers 910 and 914, respectively. Next, sum and difference operations on a portion of the SUM term, i.e., the minima peaks of the SUM term, and the average of the DIFF terms of equations (7) and (8) are calculated in accordance with equations (9) and (10) to determine the individual bias current signal magnitudes associated with tube amplifiers 910 and 914:

$$BiasCurrent_{910} = \frac{1}{2}[SUM + DIFF] = \frac{1}{2}[2 * BiasCurrent_{910}] \quad (9)$$

$$BiasCurrent_{914} = \frac{1}{2}[SUM - DIFF] = \frac{1}{2}[2 * BiasCurrent_{914}] \quad (10)$$

It is noted that signals, $BiasCurrent_{912}$ and $BiasCurrent_{916}$, which represent the individual bias current signal magnitudes conducted by tube amplifiers 912 and 916, respectively, may be similarly determined.

As can be seen, therefore, a determination of the bias current conducted by each individual tube amplifier of each push-pull pair yields a determination as to the symmetry of operation with respect to each individual tube amplifier of each push-pull pair. That is to say, in other words, that a determination of the respective magnitudes of signals, $BiasCurrent_{910}$ and $BiasCurrent_{912}$, yields a determination as to whether tube amplifiers 910 and 912 are contributing equally during the "push" phase of operation. Similarly, a determination of the respective magnitudes of signals, $BiasCurrent_{914}$ and $BiasCurrent_{916}$, yields a determination as to whether tube amplifiers 914 and 916 are contributing equally during the "pull" phase of operation.

Figure 10:
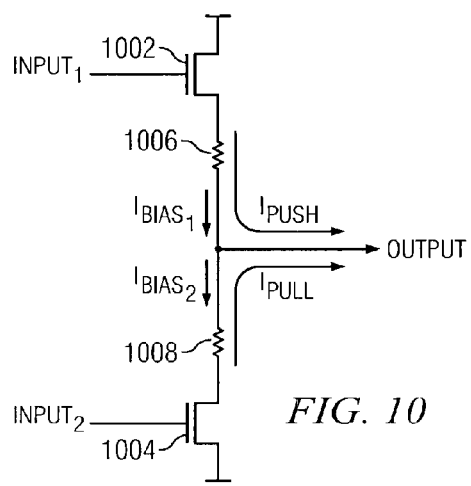
FIG. 10 illustrates an alternate embodiment of a push-pull amplification stage.

It is noted that while various embodiments are provided in relation to tube amplifier implementations, the same principles may be readily applied to solid-state applications as well. Turning to FIG. 10, for example, a push-pull amplification stage is illustrated, whereby the "push" phase of operation yields current signal, $I_{PUSH}$, as provided by the conductive state of field effect transistor (FET) 1002. Similarly, the "pull" phase of operation yields current signal, $I_{PULL}$, as provided by the conductive state of FET 1004. Bias current signals, $I_{BIAS1}$ and $I_{BIAS2}$, are also conducted by FETs 1002 and 1004 through resistive components 1006 and 1008, respectively, as illustrated.

The voltages existing across bias current sensing elements 1006 and 1008 may be similarly processed, as discussed above, to yield a minima peak detected sum term and an averaged difference term in accordance with equations (11) and (12):

$$SUM = V_{1006} + V_{1008} = I_{BIAS1}R_{1006} + I_{BIAS2}R_{1008} \quad (11)$$

$$DIFF = V_{1006} - V_{1008} = I_{BIAS1}R_{1006} - I_{BIAS2}R_{1008}, \quad (12)$$

where $V_{1006}$ is the voltage magnitude measured across resistive component 1006, $R_{1006}$, $V_{1008}$ is the voltage magnitude measured across resistive component 1008, $R_{1008}$, and $I_{BIAS1}$ and $I_{BIAS2}$ are the individual bias current signals conducted by FETs 1002 and 1004, respectively.

A portion of the SUM term, i.e., the minima peaks of the SUM term, and the average of the DIFF terms of equations (11) and (12) may be further processed to yield expressions (13) and (14) for each individual bias current signal, $I_{BIAS1}$ and $I_{BIAS2}$, that is conducted by FETs 1002 and 1004:

$$\frac{1}{2}[SUM + DIFF] = \frac{1}{2}[2 * I_{BIAS1}R_{1006}] = I_{BIAS1}R_{1006} \quad 13)$$

$$\frac{1}{2}[SUM - DIFF] = \frac{1}{2}[2 * I_{BIAS2}R_{1008}] = I_{BIAS2}R_{1008}. \quad 14)$$

Thus, knowledge of the resistance magnitude of resistive components 1006 and 1008 and manipulation of equations (13) and (14) yields a determination of the magnitude of each individual bias current signal, $I_{BIAS1}$ and $I_{BIAS2}$, that is conducted by FETs 1002 and 1004 separately.

Figure 11:
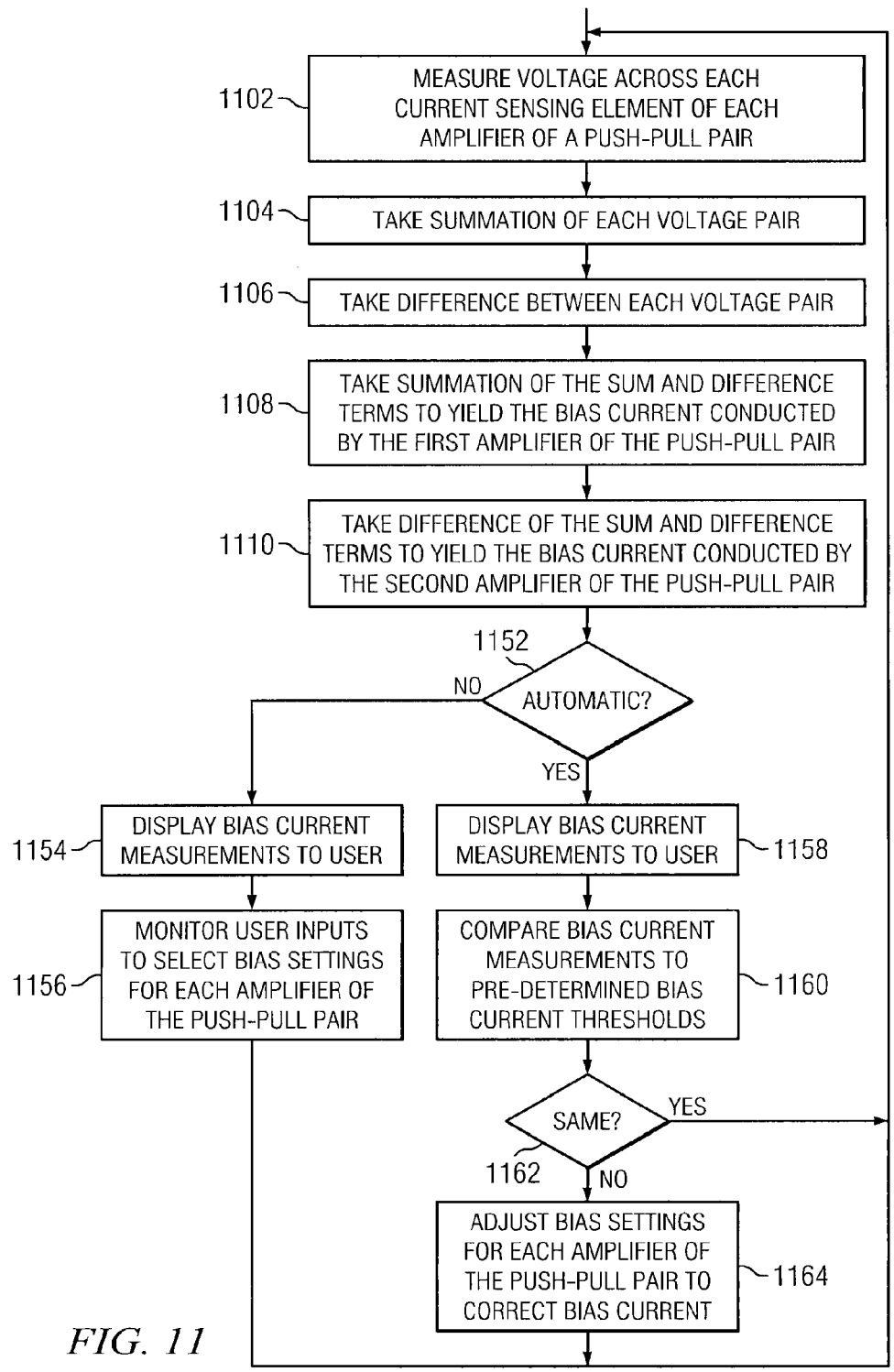
FIG. 11 illustrates a flow diagram of a method of determining and modifying the bias current conducted by each amplifier of the amplification stages of FIGS. 4, 7, 9, and 10.

Turning to FIG. 11, a flow diagram of a method of determining and modifying the bias current conducted by each amplifier of a push-pull pair is illustrated. In step 1102, the voltage across each current sensing element of each amplifier of the push-pull pair is measured. Generally speaking, voltage samples are taken over a given period of time such that an adequate number of voltage measurements exist to sufficiently characterize each voltage waveform being measured.

Each voltage signal measured in step 1102 is summed and minima peak detected in step 1104, as discussed above, for example, in relation to equations (4), (7), and (11). The difference between each voltage signal measured in step 1102 is then taken. The difference is then averaged to remove all audio frequency components in step 1106, as discussed above, for example, in relation to equations (2), (8), and (12).

In step 1108, the peak minima of the sum terms and the average of the difference terms calculated in steps 1104 and 1106, respectively, are summed to yield the individual bias current conducted by the first amplifier of the push-pull pair. In step 1110, the difference between the peak minima of the sum terms and the average of the difference terms calculated in steps 1104 and 1106, respectively, is taken to yield the individual bias current conducted by the second amplifier of the push-pull pair.

In step 1152, either an automatic or a manual mode of operation is selected. If a manual mode of operation is selected, then step 1154 displays the bias current measurements of steps 1108 and 1110 to the user. In one embodiment, for example, processor 804 of FIG. 8 provides the bias current measurements to display driver 810, which then formats the information to be displayed via display 110 of FIG. 1.

User inputs are then monitored in step 1156 to determine the manually selected bias settings for each amplifier of the push-pull pair. In one embodiment, for example, processor 804 receives the bias selections from control inputs 812 of FIG. 8, which may be provided by bias voltage control knobs 112 and 114 of FIG. 1. Processor 804 then updates DACs 806 with the correct information, so as to modify the magnitude of signals $CONTROL_1$-$CONTROL_N$ to be in conformance with control inputs 812. In response, the bias settings of each amplifier of the push-pull pair are changed to induce a magnitude of bias current within each amplifier of the push-pull pair that corresponds to the manually selected bias settings. Steps 1102-1110 are then re-executed so that processor 804 of FIG. 8 may provide the updated bias current measurements to display driver 810, which then formats the information to be displayed via display 110 of FIG. 1 as in step 1154.

If, on the other hand, an automatic mode of operation is selected, then step 1158 may be optionally executed to display the bias current measurements of steps 1108 and 1110 to the user. In one embodiment, for example, processor 804 of FIG. 8 provides the bias current measurements to display driver 810, which then formats the information to be displayed via display 110 of FIG. 1.

The bias current measurements of steps 1108 and 1110 are then monitored in step 1160 to determine whether the bias settings for each amplifier of the push-pull pair are correct, e.g., whether the bias current conducted by each amplifier of the push-pull pair is substantially equal to a pre-determined bias current threshold. In one embodiment, for example, processor 804 may seek to maintain the bias current of each amplifier of the push-pull pair to be within, e.g., 10% of a pre-determined bias current magnitude, as determined in step 1162.

If the measured bias current for any amplifier of the push-pull pair is outside the acceptable range, processor 804 updates the corresponding DACs 806 with the correct information so as to modify one or more magnitudes of signals $CONTROL_1$-$CONTROL_N$ as in step 1164. In response, the bias settings of each non-conforming amplifier of the push-pull pair is changed to induce the correct amount of bias current within each amplifier of the push-pull pair to conform to the pre-determined bias current magnitude.

Figure 12:
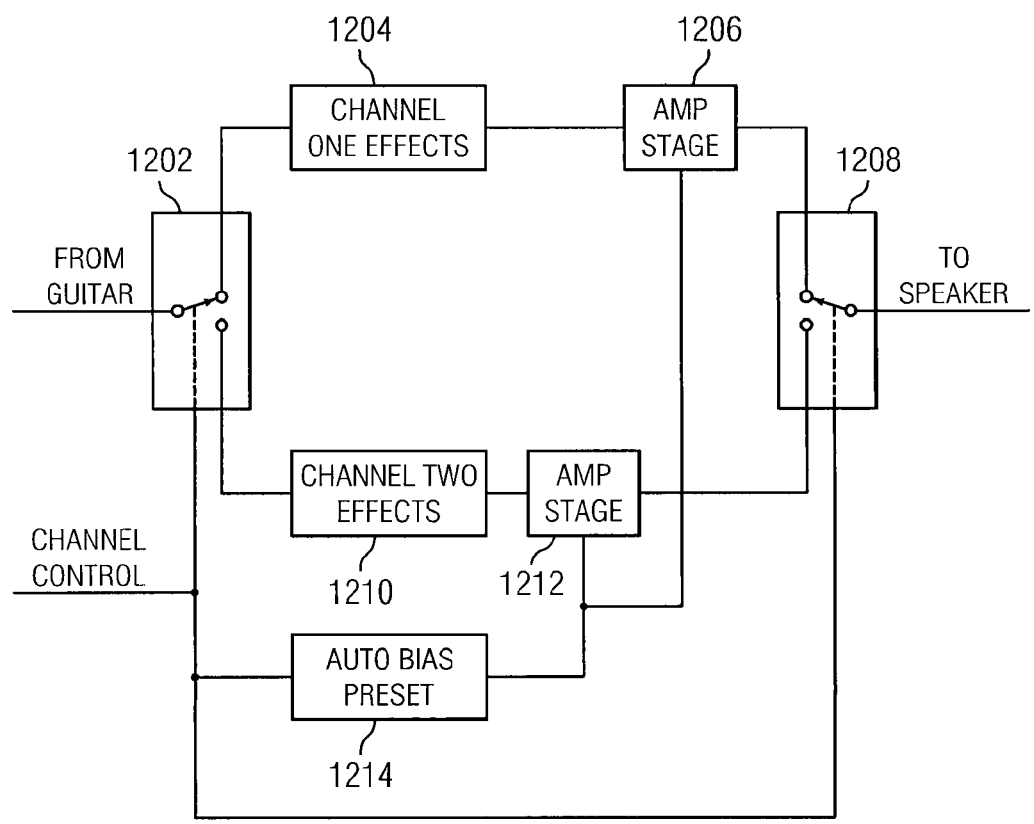
FIG. 12 illustrates a multiple channel amplifier that employs automatic biasing techniques to improve the sound generated by each channel.

Turning to FIG. 12, an alternate embodiment is illustrated, whereby automatic biasing of the amplifiers of each channel of a multiple channel amplifier is utilized to improve the sound generated by each channel. For example, the guitar amplifier of FIG. 12 utilizes multiple channels for providing various guitar tone, distortion, and/or other effects. The guitar amplifier may utilize channel effects 1204 that are configured for, e.g., a non-distorted sound, while channel effects 1210 are configured for, e.g., a distorted sound. Each channel may be selected via switches 1202 and 1208 by signal, CHANNEL CONTROL, which also selects automatic bias preset value 1214. In response, automatic bias preset value 1214 is utilized to modify the bias current conducted by each amplifier of amplification stages 1206 and 1212 to improve the sound of the selected channel. It is understood that the automatic bias control of FIG. 12 may be expanded to facilitate the automatic bias control of more than two channels in a similar fashion.

While one or more embodiments of the present invention have been illustrated in detail, the skilled artisan will appreciate that modifications and adaptations to those embodiments may be made without departing from the scope of the present invention as set forth in the following claims. For example, the individual bias current signals of the amplification stages implemented with bipolar junction transistors may be similarly measured and modified as provided herein.

What is claimed is:

1. An audio sound system, comprising:
    a first amplifier coupled to receive an audio signal and amplify the audio signal;
    a second amplifier coupled to receive the audio signal and amplify the audio signal;
    a speaker coupled to the first and second amplifiers for converting the amplified audio signal to audible sounds;
    a first current sense element coupled in a conduction path of the first amplifier;
    a second current sense element coupled in a conduction path of the second amplifier; and
    a bias current detection circuit coupled to the first and second current sense elements for detecting first and second bias current signals in the first and second amplifiers by determining a summation of the first and second current sense elements to generate a sum signal and determining a difference between the first and second current sense elements to generate a difference signal.

2. The audio sound system of claim 1, wherein the bias current detection circuit includes:
    a first summation circuit coupled to the first and second current sense elements to generate the sum signal; and
    a first difference circuit coupled to the first and second current sense elements to generate the difference signal.

3. The audio sound system of claim 2, wherein the bias current detection circuit further includes:
    a second summation circuit coupled to receive the sum and difference signals and add the sum signal to difference signal to determine the first bias current signal conducted by the first amplifier; and a second difference circuit coupled to receive the sum and difference signals and subtract the difference signal from the sum signal to determine the second bias current signal conducted by the second amplifier.

4. The audio sound system of claim 1, wherein the first and second amplifiers include first and second transistors.

5. The audio sound system of claim 1, further including a bias generator coupled to the first and second amplifiers to adjust the first and second bias current signals.

6. An audio sound system, comprising:
   a first amplifier coupled to receive an audio signal and amplify the audio signal;
   a second amplifier coupled to receive the audio signal and amplify the audio signal;
   a speaker coupled to the first and second amplifiers for converting the amplified audio signal to audible sounds;
   a first current sense element coupled in a conduction path of the first amplifier;
   a second current sense element coupled in a conduction path of the second amplifier; and
   a bias current detection circuit coupled to the first and second current sense elements for detecting first and second bias current signals in the first and second amplifiers;
   wherein the first and second amplifiers include first and second vacuum tubes.

7. The audio sound system of claim 6, wherein the first current sensing element is coupled to the first vacuum tube and the second sensing element is coupled to the second vacuum tube.

8. An audio sound system, comprising:
   a first amplifier coupled to receive an audio signal and amplify the audio signal;
   a second amplifier coupled to receive the audio signal and amplify the audio signal;
   a first current sense element coupled in a c nducti n path between a terminal of the first amplifier and a reference voltage node;
   a second current sense element coupled between a terminal of the second amplifier and the reference voltage node; and
   a bias current detection circuit coupled to the first current sense element for detecting a first bias current signal in the first amplifier and further coupled to the second current sense element for detecting a second bias current signal in the second amplifier.

9. The audio sound system of claim 8, wherein the first and second amplifiers include first and second vacuum tubes.

10. The audio sound system of claim 8, further including a bias generator coupled to the first and second amplifiers to adjust the first and second bias current signals.

11. The audio sound system of claim 8, wherein the bias current detection circuit includes:
   a first summation circuit coupled to the first and second current sense elements to generate a sum signal; and
   a first difference circuit coupled to the first and second current sense elements to generate a difference signal.

12. An audio sound system, comprising:
   a first amplifier coupled to receive an audio signal and amplify the audio signal;
   a first current sense element coupled in a conduction path of the first amplifier;
   a second amplifier coupled to receive the audio signal and amplify the audio signal;
   a second current sense element coupled in a conduction path of the second amplifier, the bias current detection circuit being coupled to the second current sense element for detecting a second bias current signal in the second amplifier; and
   a bias current detection circuit coupled to the first current sense element for detecting a first bias current signal in the first amplifier, wherein the bias current detection circuit includes,
      (a) a first summation circuit coupled to the first and second current sense elements to generate a sum signal, and
      (b) a first difference circuit coupled to the first and second current sense elements to generate a difference signal.

13. The audio sound system of claim 12, wherein the bias current detection circuit further includes:
   a second summation circuit coupled to receive the sum and difference signals and add the sum signal to the difference signal to determine the first bias current signal conducted by the first amplifier; and
   a second difference circuit coupled to receive the sum and difference signals and subtract the difference signal from the sum signal to determine the second bias current signal conducted by the second amplifier.

14. An audio sound system, comprising:
   an audio amplification stage coupled to receive an audio signal and provide first and second amplified audio signals; and
   a bias current detection circuit coupled to the audio amplification stage for detecting a first bias current signal by isolating the first bias current from the first amplified audio signal and detecting a second bias current signal by isolating the second bias current from the second amplified audio signal.

15. The audio sound system of claim 14, wherein the audio amplification stage includes:
   a first amplifier coupled to receive the audio signal and amplify the audio signal; and
   a second amplifier coupled to receive the audio signal and amplify the audio signal.

16. The audio sound system of claim 15, wherein the bias current detection circuit includes:
   a first current sensor coupled in a conduction path of the first amplifier; and
   a second current sensor coupled in a conduction path of the second amplifier.

17. The audio sound system of claim 16, wherein the bias current detection circuit further includes:
   a first summation circuit coupled to the first and second current sensors to generate a sum signal; and
   a first difference circuit coupled to the first and second current sensors to generate a difference signal.

18. The audio sound system of claim 17, wherein the bias current detection circuit further includes:
   a second summation circuit coupled to receive the sum and difference signals and add the sum signal to the difference signal to determine a first bias current signal conducted by the first amplifier; and
   a second difference circuit coupled to receive the sum and difference signals and subtract the difference signal from the sum signal to determine a second bias current signal conducted by the second amplifier.

19. The audio sound system of claim 15, wherein the first and second amplifiers include first and second vacuum tubes.

20. A method of detecting bias current in an audio amplifier, comprising:
- processing a first audio signal through a first amplifier to provide a first amplified audio signal;
- routing the first amplified audio signal through a first current sense element coupled in a conduction path of the first amplifier; and
- detecting a first bias current signal in the first amplifier by isolating the first bias current from the first amplified audio signal.

21. The method of claim 20, further including:
- processing a second audio signal through a second amplifier to provide a second amplified audio signal;
- routing the second amplified audio signal through a second current sense element coupled in a conduction path of the second amplifier; and
- detecting a second bias current signal in the second amplifier by isolating the second bias current from the second amplified audio signal.

22. The method of claim 21, wherein detecting the first bias current signal and detecting the second bias current signal includes:
- summing the first and second amplified audio signals in the first and second current sense elements to form a summation signal; and
- subtracting the second amplified audio signal in the second current sense element from the first amplified audio signal in the first current sense element to form a difference signal.

23. The method of claim 22, wherein detecting the first bias current signal and detecting the second bias current signal further includes:
- adding the sum term to the difference signal to measure the first bias current signal conducted by the first amplifier; and
- subtracting the difference signal from the sum signal to measure the second bias current signal conducted by the second amplifier.

24. The method of claim 23, further including:
comparing the first and second bias current signals; and
modifying a bias control of the first and second amplifiers in response to the comparison.

25. The method of claim 21, wherein the first and second amplifiers include first and second vacuum tubes.

26. The audio sound system of claim 11, wherein the bias current detection circuit further includes:
- a second summation circuit coupled to receive the sum and difference signals and add the sum signal to the difference signal to determine the first bias current signal conducted by the first amplifier; and
- a second difference circuit coupled to receive the sum and difference signals and subtract the difference signal from the sum signal to determine the second bias current signal conducted by the second amplifier.

* * * * *

UNITED STATES PATENT AND TRADEMARK OFFICE
CERTIFICATE OF CORRECTION

PATENT NO. : 8,400,221 B2
APPLICATION NO. : 13/028421
DATED : March 19, 2013
INVENTOR(S) : Charles C. Adams It is certified that error appears in the above-identified patent and that said Letters Patent is hereby corrected as shown below:

In the Claims:

Column 17, Claim 8, Line 39, delete the words "in a c nducti n path".

Signed and Sealed this
Fourteenth Day of May, 2013

Teresa Stanek Rea
*Acting Director of the United States Patent and Trademark Office*